United States Patent
Park et al.

(10) Patent No.: US 9,059,730 B2
(45) Date of Patent: Jun. 16, 2015

(54) PIPELINED SUCCESSIVE APPROXIMATION ANALOG-TO-DIGITAL CONVERTER

(71) Applicant: QUALCOMM Incorporated, San Diego, CA (US)

(72) Inventors: Hyunsik Park, Palo Alto, CA (US); Sotirios Limotyrakis, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/031,512

(22) Filed: Sep. 19, 2013

(65) Prior Publication Data
US 2015/0077280 A1    Mar. 19, 2015

(51) Int. Cl.
  H03M 1/12    (2006.01)
  H03M 1/38    (2006.01)
  H03M 1/00    (2006.01)
  H03M 1/06    (2006.01)
  H03M 1/80    (2006.01)

(52) U.S. Cl.
  CPC . *H03M 1/38* (2013.01); *H03M 1/12* (2013.01); *H03M 1/00* (2013.01); *H03M 1/0695* (2013.01); *H03M 1/804* (2013.01)

(58) Field of Classification Search
  CPC ....... H03M 1/00; H03M 1/12; H03M 1/0695; H03M 1/804
  USPC ................... 341/156, 155, 172, 120, 161, 162
  See application file for complete search history.

(56) References Cited

U.S. PATENT DOCUMENTS

| | | | |
|---|---|---|---|
| 5,771,012 A | 6/1998 | Shu et al. | |
| 6,124,818 A | 9/2000 | Thomas et al. | |
| 6,489,914 B1 | 12/2002 | Jones, III | |
| 7,944,387 B2 | 5/2011 | Ohnhaeuser et al. | |
| 8,344,927 B2 | 1/2013 | Jeon | |
| 8,471,751 B2 * | 6/2013 | Wang | 341/156 |
| 8,614,638 B1 * | 12/2013 | Limotyrakis et al. | 341/161 |
| 8,643,529 B2 * | 2/2014 | Lin | 341/172 |
| 2012/0097839 A1 | 4/2012 | Jung et al. | |

OTHER PUBLICATIONS

International Search Report and Written Opinion—PCT/US2014/055312—ISA/EPO—Dec. 3, 2014.

* cited by examiner

*Primary Examiner* — Joseph Lauture
(74) *Attorney, Agent, or Firm* — Patterson & Sheridan, L.L.P.

(57) ABSTRACT

A multistage analog-to-digital data conversion, including: a first stage unit configured to process an analog input signal into a first number of most significant bits using a first reference signal, and to output a first stage residue signal; a second stage unit configured to receive and process the first stage residue signal into a second number of remaining least significant bits using a second reference signal; a sampling unit configured to sample the first stage residue signal received from the first stage unit onto the second stage unit with a passive element; and an output unit configured to output a digital value that is a combination of the first number of most significant bits and the second number of remaining least significant bits.

14 Claims, 3 Drawing Sheets

PIPELINED SUCCESSIVE APPROXIMATION ANALOG-TO-DIGITAL CONVERTER

BACKGROUND

1. Field

This invention relates to data converters, and more specifically, to pipelined successive approximation analog-to-digital converters.

2. Background

The successive approximation register (SAR) analog-to-digital converters (ADCs) have been widely used as a power-efficient candidate for medium speed and medium to high resolution applications. To overcome the speed limit imposed by the technology, time-interleaving has often been employed for SAR ADCs. However, several problems have emerged with increasing the number of constituent time interleaved SAR ADC cores (sub-ADCs) and/or with the use of active elements in a pipelined SAR ADC. Known issues with direct time-interleaving include increased input loading, stringent sub-ADC matching and timing skew requirements, increased power and increased area. Furthermore, pipelining with active elements typically used to provide amplification leads to poor power efficiency and the necessity of complex error calibration with a changing environment.

SUMMARY

The present invention provides multistage analog-to-digital data conversion pipelined with only passive elements.

In one embodiment, a system to provide a multistage analog-to-digital data conversion is disclosed. The system includes: a first stage unit configured to process an analog input signal into a first number of most significant bits using a first reference signal, and to output a first stage residue signal; a second stage unit configured to receive and process the first stage residue signal into a second number of remaining least significant bits using a second reference signal; a sampling unit configured to sample the first stage residue signal received from the first stage unit onto the second stage unit with a passive element; and an output unit configured to output a digital value that is a combination of the first number of most significant bits and the second number of remaining least significant bits.

In another embodiment, a method for providing a multistage analog-to-digital conversion is disclosed. The method includes: processing an analog input signal into a first number of most significant bits using a first reference signal in a first stage; outputting a first residue signal in the first stage; receiving and processing the first stage residue signal into a second number of remaining least significant bits using a second reference signal in a second stage, wherein the first stage residue signal received from the first stage is sampled onto the second stage using no active elements; and outputting a digital value that is a combination of the first number of most significant bits and the second number of least significant bits.

In another embodiment, an apparatus for providing a multistage analog-to-digital conversion is disclosed. The apparatus includes: means for processing an analog input signal into a first number of most significant bits using a first reference signal in a first stage; means for outputting a first residue signal in the first stage; means for receiving and processing the first stage residue signal into a second number of remaining least significant bits using a second reference signal in a second stage, wherein the first stage residue signal received from the first stage is sampled onto the second stage using no active elements; and means for outputting a digital value that is a combination of the first number of most significant bits and the second number of least significant bits.

In yet another embodiment, a method to provide a multistage analog-to-digital conversion pipelined with no active elements is disclosed. The method includes: processing an analog input signal into a first number of most significant bits using a first reference signal in a first stage; outputting a first residue signal from the first stage; receiving and processing the first stage residue signal into a second number of remaining least significant bits using a second reference signal in a second stage, wherein the first stage residue signal received from the first stage is sampled onto the second stage using no active elements, wherein the first reference signal is divided by a power of two to the first number of most significant bits to produce the second reference signal for the second stage; and outputting a digital value that is a combination of the first number of most significant bits and the second number of remaining least significant bits.

Other features and advantages of the present invention should be apparent from the present description which illustrates, by way of example, aspects of the invention.

BRIEF DESCRIPTION OF THE DRAWINGS

The details of the present invention, both as to its structure and operation, may be gleaned in part by study of the appended further drawings, in which like reference numerals refer to like parts, and in which.

DETAILED DESCRIPTION

As described above, several problems have emerged with increasing the number of constituent time interleaved SAR ADC cores, which was employed for the SAR ADCs to overcome the speed limit imposed by the technology, and/or with the use of active elements in the pipelined SAR ADC. Known issues with direct time-interleaving include increased input loading, stringent sub-ADC matching and timing skew requirements, increased power and increased area. Furthermore, pipelining with active element leads to poor power efficiency and the necessity of complex error calibration with a changing environment. Certain embodiments as described herein provide for speed improvement while the disadvantages of the conventional time-interleaving and pipelining with active elements are resolved with smaller area and power. After reading this description it will become apparent how to implement the invention in various implementations and applications. Although various implementations of the present invention will be described herein, it is understood that these implementations are presented by way of example only, and not limitation. As such, this detailed description of various implementations should not be construed to limit the scope or breadth of the present invention.

In one embodiment, a data converter circuit provides multistage analog-to-digital conversion (e.g., an M-bit conversion) pipelined with only passive elements. The data converter circuit includes a first stage, a second stage, and an output unit. The first stage receives an analog input signal and processes the input signal into a first number of most significant bits (i.e., M−N bits) using a first reference signal. The first stage also outputs a first residue signal. The second stage receives and processes the first stage residue signal into a second number of remaining least significant bits (i.e., N bits) using a second reference signal, which is adjusted to be smaller than the first reference signal by a factor that is a function of the number of bits processed in the first stage. Further, the first residue signal received from the first stage is sampled onto the second stage without being amplified by active elements. The output unit outputs a digital value that is a combination of the first number of most significant bits and the second number of least significant bits.

Figure 1:
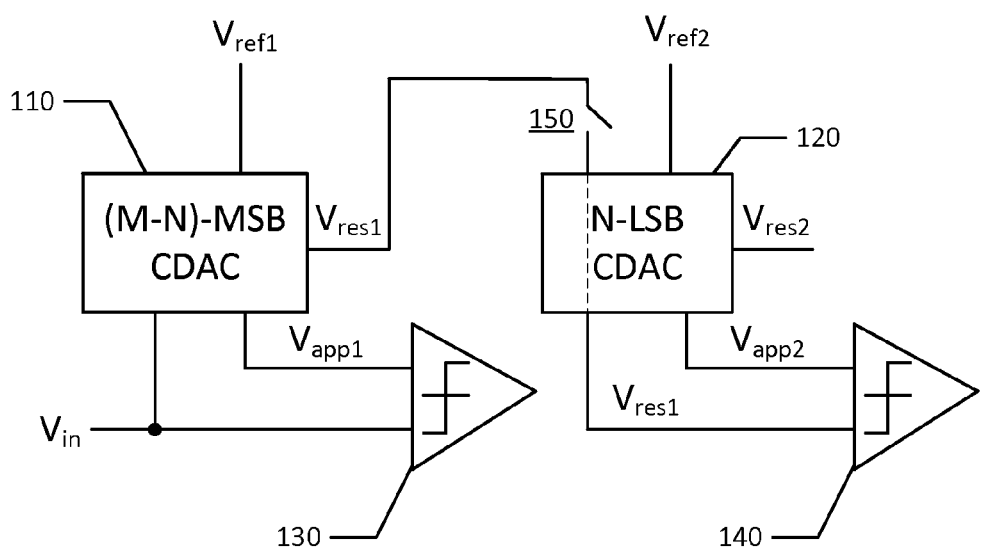
FIG. 1 is a functional block diagram of an M-bit, two-stage analog-to-digital converter architecture pipelined without active elements.

FIG. 1 is a functional block diagram of an M-bit two-stage analog-to-digital converter architecture 100 in accordance with one embodiment of the present invention. In FIG. 1, the first stage 110 is configured to process (M−N) most significant bits (MSB) with input voltages $V_{in}$ and $V_{ref1}$ and output voltages $V_{app1}$ and $V_{res1}$. The output voltage $V_{app1}$ is the analog output voltage of a capacitive digital-to-analog converter (CDAC) in the first stage 110, which is the analog approximation of the input signal based on the digital outputs of the first stage SAR ADC which is input to the first comparator 130. The other input to the first comparator 130 is the input voltage $V_{in}$. The output residue voltage, which is the difference between the input voltage $V_{in}$ and $V_{app1}$, from the first stage ($V_{res1}$) is sampled onto the second stage 120 without being amplified by an active amplifier. In the embodiment of FIG. 1, the output residue voltage of the first stage ($V_{res1}$) is sampled onto the second stage 120 using only a sampling unit such as a sample and hold switch 150. In other embodiments, the sampling of the output residue voltage of the first stage onto the second stage can be done using other passive elements such as diodes, resistors, or other forms of switches such as transistors or photoconductive devices. Upon completion of this sampling, the second stage 120 continues the SAR processing of the original first sample, while the first stage 110 initiates the SAR sampling/processing independently, for a new second sample. The second stage 120 is configured to process N least significant bits (LSB) with input voltages $V_{res1}$ and $V_{ref2}$ and output voltages $V_{app2}$ and $V_{res2}$. To compensate for the absence of the amplification of the first stage residue voltage, the reference signal for the second stage ($V_{ref2}$) is appropriately adjusted. In the illustrated embodiment of FIG. 1, the reference signal for the second stage ($V_{ref2}$) is adjusted to be substantially equivalent to the reference signal for the first stage ($V_{ref1}$) divided by two to the power of (M−N). Thus, in some embodiments, the reference signal for the second stage is set to the reference signal for the first stage divided by two to the number of bits processed in the first stage. The analog output voltage of the CDAC in the second stage ($V_{app2}$) is input to the second comparator 140. In the illustrated embodiment, the residue voltage of the second stage ($V_{res2}$) is not used since the second stage is the last stage. Although, in the illustrated embodiment, the reference signal for the second stage is programmed to be two to the number of bits processed in the first stage (which is equal to M−N), the second stage reference signal can be programmed to be different (e.g., two to M−N−1 if 1-bit redundancy is added between the first and second stages). In another embodiment, the signal divider unit divides the first reference signal by a power of two to the first number of most significant bits minus a number of redundant bits between stages to generate the second reference signal. The redundant bits between stages can be used for several purposes such as calibration.

Figure 2:
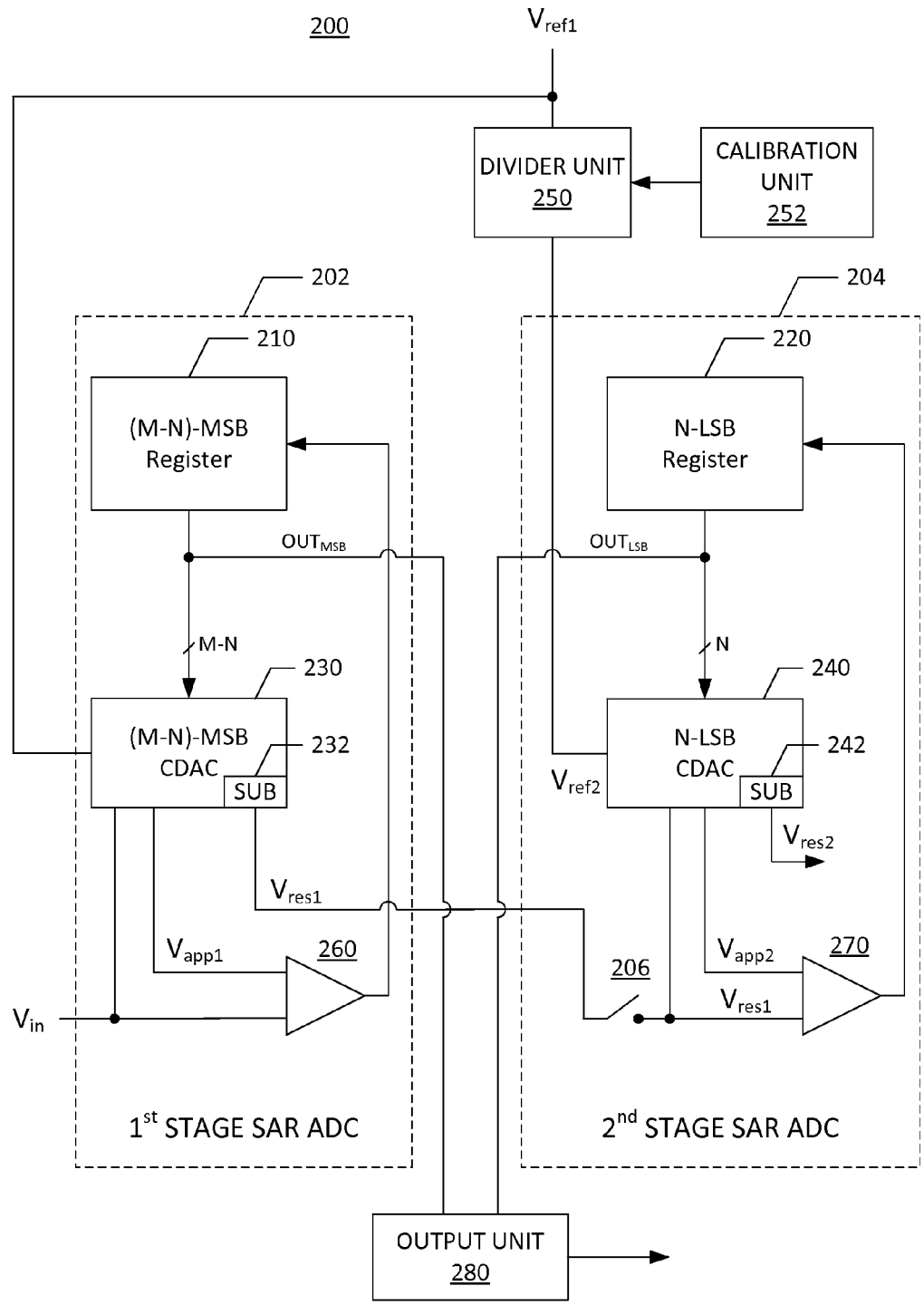
FIG. 2 is a detailed functional block diagram of an M-bit, two-stage successive approximation register (SAR) analog-to-digital converter (ADC) pipelined without active elements.

FIG. 2 is a detailed functional block diagram of an M-bit, two-stage successive approximation register (SAR) analog-to-digital converter (ADC) 200 pipelined without active elements. The illustrated embodiment of the two-stage, M-bit SAR ADC 200 shown in FIG. 2 includes a first stage unit 202, a second stage unit 204, a signal divider unit 250, and an output unit 280. The M-bit SAR ADC 200 also includes a calibration unit 252 configured to calibrate the signal divider unit 250 to increase the overall conversion precision of the M-bit SAR ADC 200. The first stage unit 202 includes (M−N)-bit register 210, (M−N)-bit CDAC 230, and a first comparator 260. The second stage unit 204 includes N-bit register 220, N-bit CDAC 240, a sampling unit such as a sample and hold switch 206, and a second comparator 270. The hold switch 206 can be connected either during the entire period while the preceding SAR ADC stage is processing its input or right after the completion of the residue generation in the preceding stage. A signal that is related to defining the sampling or processing period of the preceding stage can be used to control the hold switch 206. The output unit 280 outputs an M-bit digital value that is a combination of the (M−N) most significant bits and the N least significant bits.

In operation, (M−N)-bit CDAC 230 converts most significant (M−N) bits into an analog output value ($V_{app1}$), whose initial value is set to a value corresponding to the middle of the input full-scale range. The first comparator 260 compares the input voltage ($V_{in}$) with the converted analog output value ($V_{app1}$) of the (M−N)-bit CDAC 230. The first comparator 260 outputs and feeds back the result of the comparison to the (M−N)-bit register 210 as the next bit down from the MSB in the conversion sequence. The (M−N)-bit CDAC 230 then adjusts its output ($V_{app1}$) to the first comparator 260 based on the (M−N) bit digital value output by the (M−N)-bit register 210. The (M−N)-bit CDAC 230 also includes a subtraction unit 232 which calculates and outputs the residue output ($V_{res1}$) by computing a difference between the input voltage ($V_{in}$) and the analog output voltage ($V_{app1}$). The residue output voltage ($V_{res1}$) is then sampled onto the second stage for processing by the second stage unit 204, which continues the SAR processing of the first sample, while the first stage unit 202 initiates the SAR sampling/processing independently for a second sample.

In the second stage, the N-bit CDAC 240 converts least significant N bits into an analog output voltage ($V_{app2}$). The second comparator 270 then compares the analog output voltage ($V_{app2}$) of the N-bit CDAC 240 with the residue output voltage from the first stage ($V_{res1}$). Further, the second comparator 270 outputs the result of the comparison to the N-bit register 220 as the first bit in the N-bit sequence that this second stage is tasked to resolve. The N-bit digital value output of the N-bit register 220 is then fed into the N-bit CDAC 240 so that it can adjust its analog output and repeat the process described above until all N bits have been resolved. Similar to the (M−N)-bit CDAC 230 in the first stage unit 202, the N-bit CDAC 240 also includes a subtraction unit 242 which calculates the residue output voltage ($V_{res2}$) by computing a difference between the residue voltage from the first stage ($V_{res1}$) and the analog output voltage ($V_{app2}$). Since the second stage unit 204 is the last stage, the residue voltage ($V_{res2}$) calculated by the N-bit CDAC 240 of the second stage 204 is not used. However, if there were further stages such as a third stage (not shown), then the residue voltage ($V_{res2}$) of the second stage would be sampled onto the third stage.

To process the N least significant bits, the N-bit CDAC 240 also receives a reference signal ($V_{ref2}$) from the signal divider unit 250. In the illustrated embodiment of FIG. 2, the signal divider unit 250 divides the first stage reference signal ($V_{ref1}$)

by a factor of two to the power of (M−N) to generate the reference signal ($V_{ref2}$) for the second stage unit 204. Thus, the reference signal for the second stage processing is reduced by a factor of a power of two to the number of bits processed in the first stage (i.e., M−N). The second stage reference signal ($V_{ref2}$) can be programmed to be a value different than the first stage reference signal ($V_{ref1}$) divided by two to the power of the number of bits processed in the first stage (e.g., in this case M−N). In one embodiment, as described above, the second stage reference signal ($V_{ref2}$) can be programmed to be the first stage reference signal ($V_{ref1}$) divided by two to the power of the number of bits processed in the first stage minus 1 if one-bit redundancy is added between the two SAR pipeline stages.

Due to several different factors, including gain uncertainties and inaccuracies in the residue voltage that is sampled from one stage to the next, the reference signal for the next stage (in this case, the second stage) could be calibrated according to the value of the residue voltage as measured at the next stage. Accordingly, the M-bit SAR ADC 200 also includes a calibration unit 252 coupled to the signal divider unit 250 to calibrate the signal divider unit 250 and increase the overall conversion precision of the M-bit SAR ADC 200. For example, the calibration unit 252 can control switches in the signal divider unit 250 to add additional resistors or other components to finely adjust the reference signal for the second stage ($V_{ref2}$). Thus, the amount of adjustment depends on the size of the variation in the residue voltage while it is being transferred from one stage to the next stage caused by the gain uncertainties. In another embodiment, the error caused by the gain uncertainty can be directly calibrated in the digital domain instead of the above-mentioned analog reference calibration.

Figure 3:
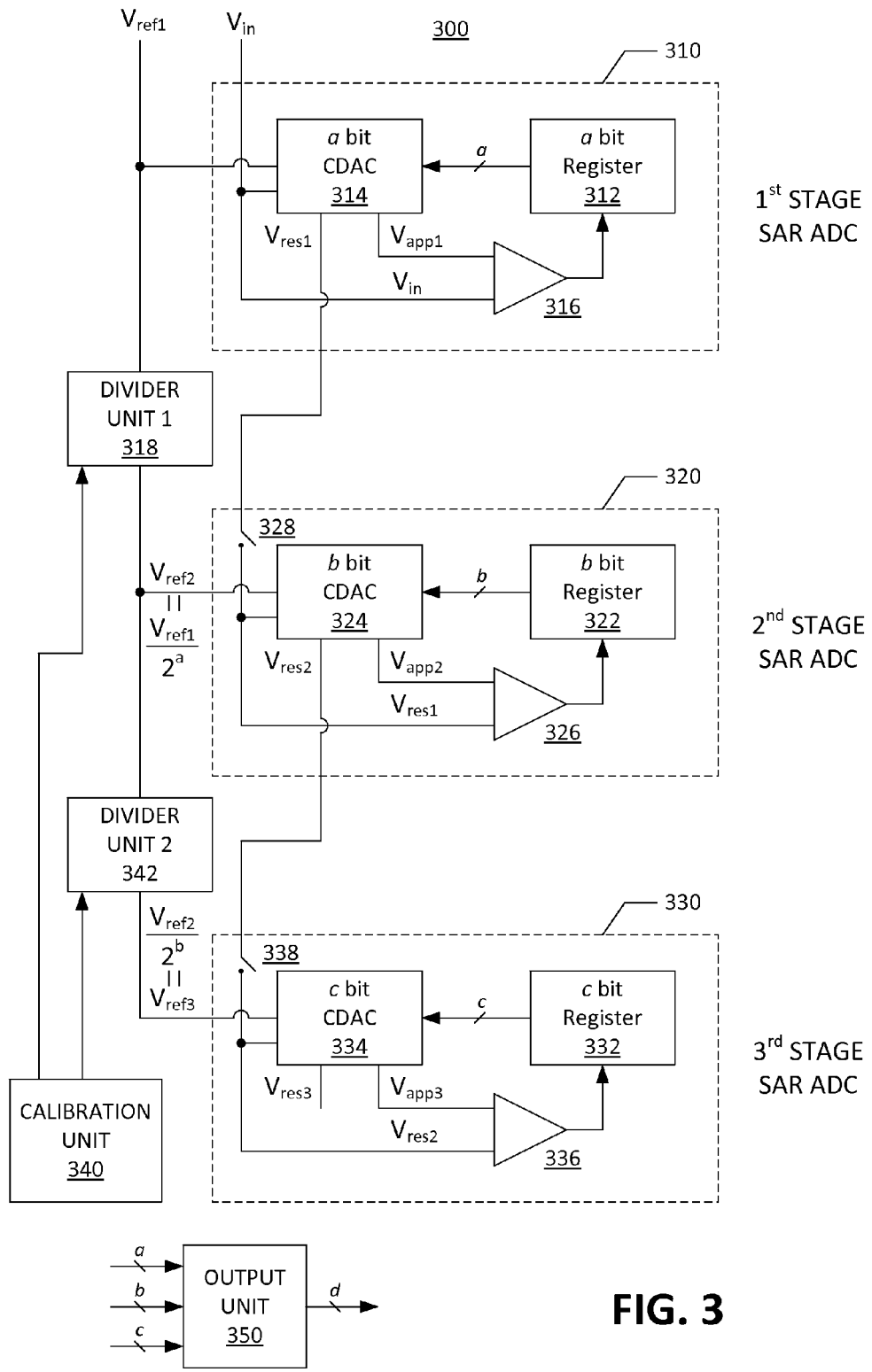
FIG. 3 is a detailed functional block diagram of a three-stage, d-bit SAR ADC pipelined without active elements.

FIG. 3 is a detailed functional block diagram of a three-stage, d-bit SAR ADC 300 pipelined without active elements. As an extension to the two-stage SAR ADC 200 illustrated in FIG. 2, the three-stage SAR ADC 300 processes 'a' bits in the first stage, 'b' bits in the second stage, and 'c' bits in the third stage, for a total of 'd' bits. The three-stage, d-bit SAR ADC 300 shown in FIG. 3 includes a first stage unit 310, a second stage unit 320, and a third stage unit 330. The three-stage, d-bit SAR ADC 300 also includes a first signal divider unit 318, a second signal divider unit 342, a calibration unit 340, and an output unit 350. As with the calibration unit 252 of the two-stage SAR ADC 200, the calibration unit 340 is configured to calibrate the signal divider units 318, 342 (which provide reference signal for second and third stages, respectively) to increase the overall conversion precision of the d-bit SAR ADC 300.

The first stage unit 310 includes a-bit register 312, a-bit CDAC 314, and a first comparator 316. The second stage unit 320 includes b-bit register 322, b-bit CDAC 324, a sampling unit such as a sample and hold switch 328, and a second comparator 326. The third stage unit 330 includes c-bit register 332, c-bit CDAC 334, a sampling unit such as a sample and hold switch 338, and a third comparator 336. As with the two-stage SAR ADC 200, the hold switches 328, 338 can be connected either during the entire period while the preceding SAR ADC stage is processing its input or right after the completion of the residue generation in the preceding stage. A signal that relates to defining the sampling or processing period of the preceding stage can be used to control the hold switches 328, 338. The output unit 350 outputs a d-bit digital value that is a combination of 'a' most significant bits, 'b' middle bits, and 'c' least significant bits.

In operation, a-bit CDAC 314 converts most significant 'a' bits into an analog output value ($V_{app1}$), whose initial value is set to a value corresponding to the middle of the input full-scale range. The first comparator 316 compares the input voltage ($V_{in}$) with the converted analog output value ($V_{app1}$) of the a-bit CDAC 314. The first comparator 316 outputs or feeds back the result of the comparison to the a-bit register 312 as the next bit down from the MSB in the conversion sequence. The a-bit CDAC 314 then adjusts its output ($V_{app1}$) to the first comparator 316 based on the 'a' bit digital value output by the a-bit register 312. The a-bit CDAC 314 also calculates and outputs the residue output ($V_{res1}$) by computing a difference between the input voltage ($V_{in}$) and the analog output voltage ($V_{app1}$). The residue output voltage ($V_{res1}$) is then sampled onto the second stage for processing by the second stage unit 320, which continues the SAR processing of the first sample, while the first stage unit 310 initiates the SAR sampling/processing independently for a second sample.

In the second stage operation, b-bit CDAC 324 converts middle 'b' bits into an analog output value ($V_{app2}$). The second comparator 326 compares the residue voltage from the first stage ($V_{res1}$) with the converted analog output value ($V_{app2}$) of the b-bit CDAC 324. The second comparator 326 outputs or feeds back the result of the comparison to the b-bit register 322 as the next bit down in the conversion sequence. The b-bit CDAC 324 then adjusts its output ($V_{app2}$) to the second comparator 326 based on the 'b' bit digital value output by the b-bit register 322. The b-bit CDAC 324 also calculates and outputs a residue output voltage ($V_{res2}$) by computing a difference between the residue voltage from the first stage ($V_{res1}$) and the analog output voltage ($V_{app2}$). This residue output voltage ($V_{res2}$) is then sampled onto the third stage for processing by the third stage unit 330, which continues the SAR processing of the first sample, while the second stage unit 320 initiates the SAR sampling/processing independently for a second sample, and the first stage unit 310 initiates the SAR sampling/processing independently for a third sample.

In the third stage, the c-bit CDAC 334 converts least significant 'c' bits into an analog output voltage ($V_{app3}$). The third comparator 336 then compares the analog output voltage ($V_{app3}$) of the c-bit CDAC 334 with the residue output voltage from the second stage ($V_{res2}$). Further, the third comparator 336 outputs the result of the comparison to the c-bit register 332 as the first bit in the c-bit sequence that this third stage is tasked to resolve. The c-bit digital value output of the c-bit register 332 is then fed into the c-bit CDAC 334 so that it can adjust its analog output and repeat the process described above until all c bits have been resolved. Similar to the a-bit CDAC 314 in the first stage unit 310 and the b-bit CDAC 324 in the second stage unit 320, the c-bit CDAC 334 also calculates the residue output voltage ($V_{res3}$) by computing a difference between the residue voltage from the second stage ($V_{res2}$) and the analog output voltage ($V_{app3}$). Since the third stage unit 330 is the last stage, the residue voltage ($V_{res3}$) calculated by the c-bit CDAC 334 of the third stage unit 330 is not used. However, if there were further stages such as a fourth stage (not shown), then the residue voltage ($V_{res3}$) of the third stage would be sampled onto the fourth stage. Accordingly, it can be seen that additional stages (e.g., more than three stages) can be added by similarly designing additional stage units as described for adding a third stage in FIG. 3.

To process the 'b' middle bits, the b-bit CDAC 324 also receives a reference signal ($V_{ref2}$) from the first signal divider unit 318. In the illustrated embodiment of FIG. 3, the first signal divider unit 318 divides the first stage reference signal ($V_{ref1}$) by a factor of two to the power of 'a' to generate the reference signal ($V_{ref2}$) for the second stage unit 320. Thus, the reference signal for the second stage processing is reduced by a factor of a power of two to the number of bits processed in the first stage (i.e., 'a'). To process the 'c' least significant bits, the c-bit CDAC 334 also receives a reference signal ($V_{ref3}$) from the second signal divider unit 342. In the illustrated embodiment of FIG. 3, the second signal divider unit 342 divides the second stage reference signal ($V_{ref2}$) by a factor of two to the power of 'b' to generate the reference signal ($V_{ref3}$) for the third stage unit 330. Thus, the reference signal for the third stage processing is reduced by a factor of a power of two to the number of bits processed in the second stage (i.e., 'b'). As before, second and third stage reference signals ($V_{ref2}$ and $V_{ref3}$) can be programmed to be values that are different than the previous stage reference signals divided by two to the power of the number of bits processed in the previous stage if bit redundancy mentioned above is introduced between the pipeline stages.

The three-stage, d-bit SAR ADC 300 also includes a calibration unit 340 coupled to the signal divider units 318, 342 to calibrate them and increase the overall conversion precision of the three-stage, d-bit SAR ADC 300. For example, the calibration unit 340 can control switches in the signal divider units 318, 342 to add additional resistors to finely adjust the reference signals for the second stage ($V_{ref2}$) and the third stage ($V_{ref3}$). Thus, the amount of adjustment depends on the size of the variation in the residue voltage transferred from one stage to the next stage caused by the gain uncertainties during the transfer process.

There are several benefits to using the proposed pipelined SAR architecture shown in FIG. 1 through FIG. 3 in addition to smaller area, reduced power and higher speed. For example, the absence of active elements in the residue path reduces area and power, and enhances speed and accuracy over process, temperature and supply voltage compared to a case where active elements are indeed used. Moreover, such an active element would need to be a precision active amplifier design which would face severe challenges as the CMOS technology scaling continues. The proposed pipelined SAR architecture also provides the ability to independently determine the CDAC unit capacitors for the first, second, and third stages. If pipelining were not used and the stages were unified in a single SAR ADC, the capacitors comprising that part of the unified CDAC that corresponds to the second and third stages would essentially be smaller for a given total input capacitance requirement and thus may limit the conversion performance due to potential mismatch from the smaller unit capacitor size. These capacitors would be small in an effort to limit the overall ADC input capacitance. In the proposed embodiments, this limitation is removed and the size of the capacitors of the second and third stages can be increased without further increasing the input capacitance of the ADC.

Although several embodiments of the invention are described above, many variations of the invention are possible. For example, in some embodiments, more than three pipelining stages of the sub-ADCs can be used. In another example, any digital-to-analog converter (DAC) can be used in place of the capacitive digital-to-analog converter (CDAC). Additionally, features of the various embodiments may be combined in combinations that differ from those described above. For example, in the embodiments described above, comparators 130, 140, 260, 270, 316, 326, 336 are shown to compare an input or residue signal to an approximation signal generated by an appropriate CDAC. These comparators may still compare (i) their input/residue signal to (ii) their approximation signal but with signals (i) and (ii) combined in a different way by the CDAC rather than being two completely separate signals as described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A system to provide a multistage analog-to-digital data conversion, the system comprising:
   a first stage unit configured to process an analog input signal into a first number of most significant bits using a first reference signal, and to output a first stage residue signal;
   a signal divider unit configured to divide the first reference signal to generate a second reference signal, wherein the second reference signal is adjusted to be smaller than the first reference signal by a factor that is a function of the first number of most significant bits;

a second stage unit configured to receive and process the first stage residue signal into a second number of remaining least significant bits using the second reference signal;
a sampling unit configured to sample the first stage residue signal received from the first stage unit onto the second stage unit with a passive element; and
an output unit configured to output a digital value that is a combination of the first number of most significant bits and the second number of remaining least significant bits.

2. The system of claim 1, wherein the signal divider unit divides the first reference signal by a power of two to the first number of most significant bits to generate the second reference signal.

3. The system of claim 1, wherein the signal divider unit divides the first reference signal by a power of two to the first number of most significant bits minus a number of redundant bits between stages to generate the second reference signal.

4. The system of claim 1, further comprising:
a calibration unit coupled to the signal divider unit to calibrate the signal divider unit and increase an overall conversion precision of the system by adjusting the second reference signal,
wherein an amount of adjustment to the second reference signal is proportional to variation in the first stage residue signal due to gain uncertainties and inaccuracies during a transfer of the first stage residue signal to a subsequent stage.

5. The system of claim 1, wherein the sampling unit is a sample and hold switch.

6. The system of claim 1, wherein the first stage unit comprises:
a first register to store the first number of most significant bits corresponding to the analog input signal;
a first digital-to-analog converter (DAC) to convert the first number of most significant bits into a first stage approximate of the analog input signal and to generate the first stage residue signal; and
a first comparator to compare the analog input signal with the first stage approximate of the analog input signal and to output a first digital output,
wherein the first digital output is fed back to the first register to adjust the first number of most significant bits.

7. The system of claim 1, wherein the second stage unit comprises:
a second register to store the second number of remaining least significant bits corresponding to the first stage residue signal;
a second digital-to-analog converter (DAC) to convert the second number of remaining least significant bits into a second stage approximate of the first stage residue signal; and
a second comparator to compare the first stage residue signal with an approximate of the first stage residue signal, and output a second digital output, which is fed back to the second register to adjust the second number of remaining least significant bits.

8. A method to provide a multistage analog-to-digital conversion, the method comprising:
processing an analog input signal into a first number of most significant bits using a first reference signal in a first stage;
dividing the first reference signal by a power of two to the first number of most significant bits to produce the second reference signal;
outputting a first stage residue signal in the first stage;
receiving and processing the first stage residue signal into a second number of remaining least significant bits using a second reference signal in a second stage, wherein the first stage residue signal received from the first stage is sampled onto the second stage using no active elements; and
outputting a digital value that is a combination of the first number of most significant bits and the second number of least significant bits.

9. A method to provide a multistage analog-to-digital conversion, the method comprising:
processing an analog input signal into a first number of most significant bits using a first reference signal in a first stage, comprising:
storing the first number of most significant bits corresponding to the analog input signal using a first register;
converting the first number of most significant bits into a first stage approximate of the analog input signal and generating a first stage residue signal using a first digital-to-analog converter (DAC); and
comparing the analog input signal with the first stage approximate of the analog input signal and outputting a first digital output based on the comparison, wherein the first digital output is fed back to the first register to adjust the first number of most significant bits;
outputting the first stage residue signal in the first stage;
receiving and processing the first stage residue signal into a second number of remaining least significant bits using a second reference signal in a second stage,
wherein the first stage residue signal received from the first stage is sampled onto the second stage using no active elements; and
outputting a digital value that is a combination of the first number of most significant bits and the second number of least significant bits.

10. A method to provide a multistage analog-to-digital conversion, the method comprising:
processing an analog input signal into a first number of most significant bits using a first reference signal in a first stage;
outputting a first stage residue signal in the first stage;
receiving and processing the first stage residue signal into a second number of remaining least significant bits using a second reference signal in a second stage, wherein the first stage residue signal received from the first stage is sampled onto the second stage using no active elements, wherein the receiving and processing comprises:
storing the second number of least significant bits corresponding to the first stage residue signal using a second register;
converting the second number of least significant bits into a second stage approximate of the first stage residue signal from the first stage using a second digital-to-analog converter (DAC); and
comparing the first stage residue signal with the second stage approximate of the first stage residue signal and outputting a second digital output based on the comparison, wherein the second digital output is fed back to the second register to adjust the second number of least significant bits; and
outputting a digital value that is a combination of the first number of most significant bits and the second number of least significant bits.

11. An apparatus for providing a multistage analog-to-digital conversion, the apparatus comprising:

means for processing an analog input signal into a first number of most significant bits using a first reference signal in a first stage;
means for dividing the first reference signal by a power of two to the first number of most significant bits to produce a second reference signal;
means for outputting a first stage residue signal in the first stage;
means for receiving and processing the first stage residue signal into a second number of remaining least significant bits using the second reference signal in a second stage, wherein the first stage residue signal received from the first stage is sampled onto the second stage using no active elements; and
means for outputting a digital value that is a combination of the first number of most significant bits and the second number of remaining least significant bits.

12. An apparatus for providing a multistage analog-to-digital conversion, the apparatus comprising:
means for processing an analog input signal into a first number of most significant bits using a first reference signal in a first stage;
means for dividing the first reference signal by a power of two to the first number of most significant bits minus a number of redundant bits between stages to produce a second reference signal for a second stage;
means for outputting a first stage residue signal in the first stage;
means for receiving and processing the first stage residue signal into a second number of remaining least significant bits using the second reference signal in the second stage, wherein the first stage residue signal received from the first stage is sampled onto the second stage using no active elements; and
means for outputting a digital value that is a combination of the first number of most significant bits and the second number of remaining least significant bits.

13. An apparatus for providing a multistage analog-to-digital conversion, the apparatus comprising:
means for processing an analog input signal into a first number of most significant bits using a first reference signal in a first stage, comprising:
means for storing the first number of most significant bits corresponding to the analog input signal using a first register;
means for converting the first number of most significant bits into a first stage approximate of the analog input signal and generating a first stage residue signal using a first digital-to-analog converter (DAC);
means for comparing the analog input signal with the first stage approximate of the analog input signal and outputting a first digital output based on the comparison, wherein the first digital output is fed back to the first register to adjust the first number of most significant bits;
means for outputting the first stage residue signal;
means for receiving and processing the first stage residue signal into a second number of remaining least significant bits using a second reference signal in a second stage, wherein the first stage residue signal received from the first stage is sampled onto the second stage using no active elements; and
means for outputting a digital value that is a combination of the first number of most significant bits and the second number of remaining least significant bits.

14. An apparatus for providing a multistage analog-to-digital conversion, the apparatus comprising:
means for processing an analog input signal into a first number of most significant bits using a first reference signal in a first stage, comprising:
means for outputting a first stage residue signal in the first stage; and
means for receiving and processing the first stage residue signal into a second number of remaining least significant bits using a second reference signal in a second stage, wherein the first stage residue signal received from the first stage is sampled onto the second stage using no active elements;
means for storing the second number of remaining least significant bits corresponding to the first stage residue signal using a second register;
means for converting the second number of least significant bits into a second stage approximate of the first stage residue signal using a second digital-to-analog converter (DAC);
means for comparing the first stage residue signal with the second stage approximate of the first stage residue signal and outputting a second digital output based on the comparison, wherein the second digital output is fed back to the second register to adjust the second number of least significant bits; and
means for outputting a digital value that is a combination of the first number of most significant bits and the second number of remaining least significant bits.

* * * * *